United States Patent [19]
Kametani

[11] Patent Number: 5,724,540
[45] Date of Patent: Mar. 3, 1998

[54] MEMORY SYSTEM HAVING A COLUMN ADDRESS COUNTER AND A PAGE ADDRESS COUNTER

[75] Inventor: Masatsugu Kametani, Tsuchiura, Japan

[73] Assignee: Hitachi, Ltd., Tokyo, Japan

[21] Appl. No.: 113,811

[22] Filed: Aug. 31, 1993

Related U.S. Application Data

[63] Continuation-in-part of Ser. No. 79,852, Jun. 22, 1993, Pat. No. 5,335,336, which is a continuation of Ser. No. 329,306, Mar. 27, 1989, abandoned.

[30] Foreign Application Priority Data

Mar. 28, 1988 [JP] Japan .................................. 63-074145
Aug. 31, 1992 [JP] Japan .................................. 4-232416

[51] Int. Cl.⁶ .................................................. G06F 12/02
[52] U.S. Cl. .............................. 395/421.1; 395/421.07; 395/421.09; 395/495
[58] Field of Search ........................ 364/200 MS File, 364/900 MS File; 395/400, 425, 412, 416, 418, 419, 421.08, 421.09, 421.07, 421.1, 432, 494, 495, 496, 464, 421.03

[56] References Cited

U.S. PATENT DOCUMENTS

| | | | |
|---|---|---|---|
| 3,618,041 | 11/1971 | Horikoshi | 395/425 |
| 3,736,574 | 5/1973 | Gersbach | 365/229 |
| 4,286,321 | 8/1981 | Baker et al. | 395/325 |
| 4,334,295 | 6/1982 | Nagami | 365/222 |
| 4,393,472 | 7/1983 | Shimada et al. | 365/230.04 |
| 4,443,847 | 4/1984 | Bradley et al. | 395/425 |
| 4,521,846 | 6/1985 | Scalzi et al. | 395/419 |
| 4,608,666 | 8/1986 | Uchida | 365/222 |
| 4,631,701 | 12/1986 | Kappeler et al. | 365/222 |
| 4,691,279 | 9/1987 | Danilenko et al. | 395/250 |
| 4,727,510 | 2/1988 | Scheuneman et al. | 395/400 |
| 4,768,144 | 8/1988 | Winter et al. | 395/600 |
| 4,796,232 | 1/1989 | House | 365/222 X |
| 4,797,850 | 1/1989 | Amitai | 395/425 |
| 4,800,531 | 1/1989 | Dehganpour et al. | 365/222 |
| 4,809,156 | 2/1989 | Taber | 395/421.08 |
| 4,823,324 | 4/1989 | Taylor et al. | 365/230.03 |

(List continued on next page.)

FOREIGN PATENT DOCUMENTS 62-197842  9/1987  Japan .

OTHER PUBLICATIONS

80386 Hardware Reference Manual, issued by Intel Corp., 1986, pp. 43–62.

*Primary Examiner*—Eddie P. Chan
*Assistant Examiner*—Hiep T. Nguyen
*Attorney, Agent, or Firm*—Antonelli, Terry, Stout & Kraus, LLP

[57] ABSTRACT

A memory system which includes a memory array having a column address input and a page address input, addressed by a column pointer and a page pointer; a processor for accessing the memory array with employment of a data bus and an address bus in response to an access instruction; a page register unit coupled to the processor, for storing therein a page address and a first offset address, which are received from the processor via the data bus; a page address counter unit coupled to the page register unit for performing a predetermined calculation to the page address by utilizing the first offset address; a column register unit coupled to the processor, for storing therein a column address and a second offset address, which are received via the address bus from the processor; a column address counter unit coupled to the column register unit, for performing a preselected calculation to the column address with employment of the second offset address; and an address latch unit coupled to the page address counter unit and the column address counter unit, for outputting outputs derived from the page address counter unit and the column address counter unit to the column address input and the page address input of the memory array in order to access the memory array by the processor. Overhead of the process for address calculations to manage the memory system is reduced, so that a high-speed accessing operation is realized.

30 Claims, 15 Drawing Sheets

U.S. PATENT DOCUMENTS

| | | | |
|---|---|---|---|
| 4,835,734 | 5/1989 | Kodaira et al. | 395/419 |
| 4,847,758 | 7/1989 | Olson et al. | 395/425 |
| 4,849,937 | 7/1989 | Yoshimoto | 365/230.04 |
| 4,870,622 | 9/1989 | Aria et al. | 365/230.03 |
| 4,907,199 | 3/1990 | Dosaka et al. | 365/222 X |
| 4,914,575 | 4/1990 | Kihara et al. | 395/425 |
| 4,933,835 | 6/1990 | Sachs et al. | 395/425 |
| 4,933,910 | 6/1990 | Olson et al. | 365/230.02 |
| 4,937,736 | 6/1990 | Chang et al. | 395/418 |
| 4,937,791 | 6/1990 | Steele et al. | 365/230.03 |
| 4,984,151 | 1/1991 | Dujari | 395/775 |
| 4,991,082 | 2/1991 | Yoshizawa et al. | 395/419 |
| 5,193,160 | 3/1993 | Tsubota | 395/416 |
| 5,276,850 | 1/1994 | Sakane | 395/412 |
| 5,428,759 | 6/1995 | Smith et al. | 395/419 |

FIG.5

| control<br>functions | $\overline{CS}$ | $\overline{BE2}$ | $\overline{BE3}$ | W/R | $\overline{BE1}$ | Double/word<br>/Byte,(Inst.no.) |
|---|---|---|---|---|---|---|
| Write Data at<br>Page Register | 0 | 0 | 0 | 1 | 1 | W<br>(WTCD1) |
| Push Data at Page<br>Register<br>(INC and write) | 0 | 0 | 0 | 1 | 0 | D<br>(WTCD0) |
| Read Data from<br>Page Register | 0 | 0 | 0 | 0 | 1 | W<br>(RDCD1) |
| Pop Data from<br>Page Register<br>(DEC and Store) | 0 | 0 | 0 | 0 | 0 | D<br>(RDCD0) |
| Write Counter<br>OFFSET Register | 0 | 0 | 1 | 1 | 0 | W<br>(WH)<br>(WTCD4) |
| Read Counter<br>OFFSET Register | 0 | 0 | 1 | 0 | 0 | W<br>(WH)<br>(RDCD4) |
| Set Stack Point | 0 | 1 | 0 | 1 | 1 | B<br>(WTCD3) |
| Read Stack Point | 0 | 1 | 0 | 0 | 1 | B<br>(RDCD3) |
| Set Bank Point<br>or Mode | 0 | 0 | 1 | 1 | 1 | B<br>(WTCD5) |
| Read Bank Point | 0 | 0 | 1 | 0 | 1 | B<br>(RDCD5) |
| Increment Stack<br>Point | 0 | 1 | 1 | 1 | 0 | B/W<br>(WTCD6) |
| Decrement Stack<br>Point | 0 | 1 | 1 | 0 | 0 | B/W<br>(RDCD6) |
| Increment Bank<br>Point | 0 | 1 | 1 | 1 | 1 | B<br>(WTCD7) |
| Decrement Bank<br>Point | 0 | 1 | 1 | 0 | 1 | B<br>(RDCD7) |

MODE (applies to Set Bank Point or Mode / Read Bank Point rows)

FIG. 6

| control<br>functions | /CS | /BHE2 | /BHE3 | W/R | /BHE1 | D22 | D23 |
|---|---|---|---|---|---|---|---|
| Set Bank Point | 0 | 0 | 1 | 1 | 1 | 0 | 0 |
| Set Operation Mode | 0 | 0 | 1 | 1 | 1 | 1 | 0 |
| Set Extra Address | 0 | 0 | 1 | 1 | 1 | 0 | 1 |
| Reset | 0 | 0 | 1 | 1 | 1 | 1 | 1 |
| Read Bank Point | 0 | 0 | 1 | 0 | 1 | — | — |
| BYTE ACCESS MODE | | | | | | | |

FIG.7

*Set Mode bits ( bit 6=1, bit 7=0)

| bit NO. value | bit 0 | bit 1 | bit 2 | bit 3 | bit 4 | bit 5 |
|---|---|---|---|---|---|---|
| Value = 0 | PGTRG Disable | PGREG INC | PGREG INC · DEC SEL | PGCHGTRG Disable | Temporary ADDRREG Enable | Direct Address (from CPU) Disable |
| Value = 1 | PGTRG Enable | PGREG DEC | PGREG ADD | PGCHGTRG Enable (for DRAM control) | Temporary ADDRREG Disable | Direct Address (from CPU) Enable (selected) |
| | | External Data ADD | | | | |

FIG.8

| mode \ function | A12~A2 W/R,/BE0~/BE3 | Mode bit 0 | Mode bit 1 | Mode bit 2 | Mode bit 33 | Mode bit 4 | Mode bit 5 |
|---|---|---|---|---|---|---|---|
| Access and PG Change | X | 1 | | | | | |
| | | 1 | X | X | 1 | 1 | X |
| | | 1 | | | | | |
| Access and PG no Change | X | 0 | | | X | X | X |
| | | 1 | X | X | 0 | X | X |
| | | 1 | | | X | 0** | X |

*Mode bits ( bit 5=0,bit 4=1,bit 3=1,bit 2=X,bit 1=X,bit 0=X )

**on WRCD0 not enable

FIG.9

```
Instruction                                      ES=0A000H
PGCTLADDR      EQU     xxx           ;PGCTLADDR
                                     ;=      for CDRAM(x=0)
               ORG     PGCTLADDR+2   ;=      for CDRAM(x=0)
WTDTPGREG      DW      0000H         ;WRITE,16bit
               ORG     PGCTLADDR
PSHDTPGREG     DW      0000H,0000H   ;WRITE,32bit(Hi used)
               ORG     PGCTLADDR+2
RDDTPGREG      DW      0000H         ;READ,16bit
               ORG     PGCTLADDR
POPDTPGREG     DW      0000H,0000H   ;READ,32bit(Hi used)
               ORG     PGCTLADDR+1
WTCNTOFFREG    DW      0000H         ;WRITE,16bit
               ORG     PGCTLADDR+1
RDCNTOFFREG    DW      0000H         ;READ,16bit
               ORG     PGCTLADDR+3
SETSP          DB      00H           ;WRITE,8bit( 11~8bit used)
               ORG     PGCTLADDR+3
RDSP           DB      00H           ;READ,8bit( 11~8bit used)
               DB      00H           ;WRITE,8bit
               ORG     PGCTLADDR+2
RDBP           DB      00H           ;READ,8bit
               ORG     PGCTLADDR
INCSP          DW      0000H         ;READ,16bit
SETMD          ORG     PGCTLADDR     ;WRITE,8bit
               DB      00H
               ORG     PGCTLADDR
INCBP          DB      00H           ;WRITE,8bit
               ORG     PGCTLADDR
DECBP          DB      00H           ;READ,8bit

#Instruction output method
        PGCTLx   ES : [Inst.] , AX(or AL) for WRITE    AX for 16bit
        PGCTLx   AX(or AL) , ES : [Inst.] for READ     AL for 8bit
```

FIG.10

```
; Parameter name         Parameter value
  SB            EQU      00H              : Set Bank Point
  SOMD          EQU      40H              : Set Operation Mode
  SEXTRA        EQU      80H              : Set Extra Address
  PGCTLRES      EQU      0C0H             : Reset ; Data name              Data value
  TPGRGEN       EQU      40H+00H          : Temporary Reg. Selection
                                            $(000000)_2$ DPGADDR       EQU      40H+16H          : Direct Addressing
                                            $(100000)_2$ INCPGRG                40H+19H          ; INC.PGREG$(011001)_2$
  DECPGRG                40H+1BH          ; DEC.PGREG$(011001)_2$
  ADDPGRG       EQU      40H+1DH          ; ADD.PGREG$(011101)_2$
  ADDPGRGE      EQU      40H+16H          ; ADD.EXDATA$(010110)_2$
  NCHGPGRG      EQU      40H+10H          ; No Change PGREG$(010000)_2$ ; BNKPDATA      EQU      n                Set n by User ; EXDATA        EQU      n                Set n by User

Instruction output Method
     PGCTL ES : [MDSET] , Parameter+Data
 or  PGCTL ES : [BPSET] , Parameter+Data
```

FIG. 11

| control function | (A12~A8) | (A7~A4) | (A3,A2) | W/R | /BE3~/DE0 | Word/Byte | Inst.no. |
|---|---|---|---|---|---|---|---|
| Write Data at Column Register | (XXXXX) | (XXXX) | (XX) | 1 | (1110) | B | WTCD0 |
| Write Data at Column Register (INC and write) | (XXXXX) | (XXXX) | (XX) | 1 | (1101) | B | WTCD1 |
| Write Data at Column Register (DEC and Write) | (XXXXX) | (XXXX) | (XX) | 0 | (1110) | B | RDCD0 |
| Add.Imm.Data to Column Register | (XXXXX) | (XXXX) | (XX) | 0 | (1101) | B | RDCD1 |
| Write Counter OFFSET Register | (XXXXX) | (XXXX) | (XX) | 1 | (1011) | B | WTCD2 |
| Add.Imm.Data to Counter OFFSET Reg. | (XXXXX) | (XXXX) | (XX) | 0 | (1011) | B | RDCD2 |
| Set Stack Point | (XXXXX) | (XXXX) | (XX) | 1 | (0111) | B | WTCD3 |
| Set Bank Point | (XXXXX) | (XXXX) | (XX) | 0 | (0111) | B | RDCD3 |
| Set Modo bits | (11100) | (XXXX) | (XX) | 1 | (1001) | W | WTCD4 |
| Set Through Mode | (11100) | (1111) | (00) | 0 | (1001) | W | RDCD8 |
| Set Add. Mode | (11100) | (1111) | (01) | 0 | (1001) | W | RDCD9 |
| Set INC Mode | (11100) | (1111) | (10) | 0 | (1001) | W | RDCD10 |
| Set DEC Mode | (11100) | (1111) | (11) | 0 | (1001) | W | RDCD11 |
| Increment Stack Point | (11101) | (1111) | (00) | 1 | (1001) | W | WTCD12 |
| Decrement Stack Point | (11101) | (1111) | (00) | 0 | (1001) | W | RDCD12 |
| Increment Bank Point | (11101) | (1111) | (01) | 1 | (1001) | W | WTCD13 |
| Decrement Bank Point | (11101) | (1111) | (01) | 0 | (1001) | W | RDCD13 |
| Set Treg Mode | (11101) | (1111) | (10) | 1 | (1001) | W | WTCD14 |
| Patial Reset | (11101) | (1111) | (10) | 0 | (1001) | W | RDCD14 |
| Set No Change Mode | (11101) | (1111) | (11) | 1 | (1001) | W | WTCD15 |
| CACTL Reset | (11101) | (1111) | (11) | 0 | (1001) | W | RDCD15 |
| STCAREG | (11110) | (n) | (00) | 1 | (1001) | W | WTCD16 |
| LDCAREG | (11110) | (n) | (01) | 1 | (1001) | W | WTCD17 |
| XCHGCAREG | (11110) | (n) | (10) | 1 | (1001) | W | WTCD18 |
| PGCASEN | (11110) | (1111) | (11) | 1 | (1001) | W | WTCD19 |
| POPDTINC | (11110) | (1111) | (00) | 0 | (1001) | W | RDCD16 |
| POPDTDEC | (11110) | (1111) | (01) | 0 | (1001) | W | RDCD17 |
| POPDTADD | (11110) | (1111) | (10) | 0 | (1001) | W | RDCD18 |
| POPDTIADD | (11110) | (n) | (11) | 0 | (1001) | W | RDCD19 |

FIG. 12

*Set Mode bits

| Add.bit value | A2 | A3 | A4 | A5 | A6 | A7 |
|---|---|---|---|---|---|---|
| Value = 0 | CATRG Disable | CAREG INC | CAREG ING-DEC SEL | CAREGCHG Disable | Temporary CAADDRREG Enable | Direct Address (from CPU) Disable |
| Value = 1 | CATRG Enable | CAREG DEC | CAREG ADD | CAREGCHG Enable (for DRAM control) | Temporary REGCAADDR Disable | Direct Address (from CPU) Enable (selected) |
| | | Software Reset | | | | |

FIG. 13

| control / functions | (A12~A18) | (A7~A4) PGCASENA4=0 PGCASDSDLA4=1 | (A3, A2) | W/R 1--WT 0--RD | BE3~BE0 | Double/Word |
|---|---|---|---|---|---|---|
| Access and CAREG Addition | (11111) | (111X) | (11) | X | (0000) | D |
|  | (11111) | (111X) | (11) | X | (1100) | W |
|  | (11111) | (111X) | (11) | X | (0011) | W |
| Access and CAREG Increment | (11111) | (111X) | (10) | X | (0000) | D |
|  | (11111) | (111X) | (10) | X | (1100) | W |
|  | (11111) | (111X) | (10) | X | (0011) | W |
| Access and CAREG Decrement | (11111) | (111X) | (01) | X | (0000) | D |
|  | (11111) | (111X) | (01) | X | (1100) | W |
|  | (11111) | (111X) | (01) | X | (0011) | W |
| Access and CAREG no change | (11111) | (111X) | (00) | X | (0000) | D |
|  | (11111) | (111X) | (00) | X | (1100) | W |
|  | (11111) | (111X) | (00) | X | (0011) | W |

FIG. 14

```
; ES=0A000H
  CACTLADDR0       EQU   CDRAMADDR
  CACTLADDR1       EQU   DDRAMADDR

WTDTCAREG        ES: [CACTLADDRx+n*4], AL          ; n=WTDATA(DT)
  PSHDTCAREG       ES: [CACTLADDRx+1+n*4], AL        ; n=WTDATA(DT)
  POPDTCAREG       AL, ES :[CACTLADDRx+n*4]          ; n=WTDATA(DT)
  ADDIDCAREG       AL, ES :[CACTLADDRx+1+n*4]        ; n=WTDATA(DT)

WTCOFFREG        ES : [CACTLADDRx+2+n*4], AL       ; n=WTDATA(DT)
  ADDIDCOFFREG     AL, ES : [CACTLADDRx+2+n*4]       ; n=WTDATA(DT)

SETSP            ES : [CACTLADDRx+3+n*4], AL       ; n=WTDATA(DT)
  SETBP            AL, ES :[CACTLADDRx+3+n*4]        ; n=WTDATA(DT)
  SETMD            ES : [CACTLADDRx+1C01H+n*4],AX    ; n=6 bits SETTHRMD         AX, ES: [CACTLADDRx+1+1CF0H]
  SETADDMD         AX, ES: [CACTLADDRx+1+1CF4H]
  SETINCMD         AX, ES: [CACTLADDRx+1+1CF8H]
  SETDECMD         AX, ES: [CACTLADDRx+1+1CFCH]

INCSP            ES: [CACTLADDRx+1+1DF0H], AX
  DECSP            AX, ES: [CACTLADDRx+1+1DF0H]

INCBP            ES: [CACTLADDRx+1+1DF4H], AX
  DECBP            AX, ES: [CACTLADDRx+1+1EF4H]

SETTREGMD        ES: [CACTLADDRx+1+1DF8H], AX
  PRES             AX, ES:[CACTLADDRx+1+1DF8H]

SETNOCHGMD       ES: [CACTLADDRx+1+1DFCH], AX
  CACTLRES         AX, ES:[CACTLADDRx+1+1DFCH]

STCAREG          ES: [CACTLADDRx+1E00H+n*16], AX   ; n=WTDATA(DT)
  LDCAREG          ES: [CACTLADDRx+1E04H+n*16], AX   ;   CAREG
  XCHGCAREG        ES: [CACTLADDRx+1E08H+n*16], AX   ;   DATA
  PGCASEN          ES: [CACTLADDRx+1EFCH], AX        ;   MOVE
                                                     ;   Instructions
     STCAREG       TREGn ←CAREG (Stack Top)
     LDCAREG       CAREG (Stack Top) ←TREGn
     XCHGCAREG     CAREG (Stack Top) ↔TREGn
     PGCASEN       PGCAS output to PGCTL POPDTINC         AX, DS: [CACTLADDRx+1EF0H]
  POPDTDEC         AX, DS: [CACTLADDRx+1EF4H]
  POPDTADD         AX, DS: [CACTLADDRx+1EF8H]
  POPDTIADD        AX, DS: [CACTLADDRx+1E0CH+n*16], AX; n=WTDATA(DT)
```

FIG. 15

```
; Data name            Data value(n) (or Inst. Data)
  TCARGEN     EQU      10H*4 (or + CACTLADDRx + 1C01H)
  DPGADDR     EQU      20H*4 (or + CACTLADDRx + 1C01H)
  INCCARG     EQU      19H*4 (or + CACTLADDRx + 1C01H)
  DECCARG     EQU      1BH*4 (or + CACTLADDRx + 1C01H)
  ADDRCARG    EQU      1DH*4 (or + CACTLADDRx + 1C01H)
  CACTLRES    EQU      1FH*4 (or + CACTLADDRx + 1C01H)
  ACCINSTEN   EQU      11H*4 (or + CACTLADDRx + 1C01H); 7~2 bit(010001)$_2$
# Instruction output Method
  SETMD                ES:[CACTLADDRx + 1C01H + Data], AX
or SETMD               ES: Inst. Data
```

FIG. 16

```
WACCADD     ES: [CACTLADDRx + 1FXCH], ERX (or ImmDD)  ;DD Data Double
WACCADDL    ES: [CACTLADDRx + 1FXCH], RX  (or ImmDW)  ;DW Data Word
WACCADDH    ES: [CACTLADDRx + 1FXEH], RX  (or ImmDW)
WACCINC     ES: [CACTLADDRx + 1FX8H], ERX (or ImmDD)
WACCINCL    ES: [CACTLADDRx + 1FX8H], RX  (or ImmDW)
WACCINCH    ES: [CACTLADDRx + 1FXAH], RX  (or ImmDW)
WACCDEC     ES: [CACTLADDRx + 1FX4H], ERX (or ImmDD)
WACCDECL    ES: [CACTLADDRx + 1FX4H], RX  (or ImmDW)
WACCDECH    ES: [CACTLADDRx + 1FX6H], RX  (or ImmDW)
WACCNCHG    ES: [CACTLADDRx + 1FX0H], ERX (or ImmDD)
WACCNCHGL   ES: [CACTLADDRx + 1FX0H], RX  (or ImmDW)
WACCNCHGH   ES: [CACTLADDRx + 1FX2H], RX  (or ImmDW)

RACCADD     ERX, ES: [CACTLADDRx + 1FXCH]
RACCADDL    RX , ES: [CACTLADDRx + 1FXCH]
RACCADDH    RX , ES: [CACTLADDRx + 1FXEH]
RACCINC     ERX, ES: [CACTLADDRx + 1FX8H]
RACCINC     RX , ES: [CACTLADDRx + 1FX8H]
RACCINC     RX , ES: [CACTLADDRx + 1FXAH]
RACCDEC     ERX, ES: [CACTLADDRx + 1FX4H]    [*X=F----PGCAS
RACCDECL    RX , ES: [CACTLADDRx + 1FX4H]            Disable
RACCDECH    RX , ES: [CACTLADDRx + 1FX6H]     X=E----PGCAS
RACCNCHG    ERX, ES: [CACTLADDRx + 1FX0H]            Enable]
RACCNCHGL   RX , ES: [CACTLADDRx + 1FX0H]
RACCNCHGH   RX , ES: [CACTLADDRx + 1FX2H]
```

MEMORY SYSTEM HAVING A COLUMN ADDRESS COUNTER AND A PAGE ADDRESS COUNTER

CROSS-REFERENCE TO RELATED APPLICATION

This Application is a Continuation-in-Part of U.S. patent application Ser. No. 08/079,852 filed on Jun. 22, 1993, now U.S. Pat. No. 5,335,336, which was a Continuation of a U.S. patent application Ser. No. 07/329,306 filed on Mar. 27, 1989, now abandoned, the contents of which are incorporated herein by reference.

BACKGROUND OF THE INVENTION

Field of the Invention

The present invention relates to a two-dimensionally arranged memory system suitable for such a processing apparatus that a large quantity of data are processed in real time.

A recent trend has been towards increasing the memory capacities of memory systems used in various computer systems.

A present computer architecture should be necessarily designed such that a workstation is equipped to have a main storage of 8M bytes to 128M bytes, and a large memory system accessible by a serial memory address is employed. This is because an OS (operating system), work areas thereof, and general-purpose file systems/table occupy a large memory area, so that if the conventional computer system is not be equipped with a linear memory system having a sufficiently large memory capacity, no practical processing operations could be effectively performed.

One conventional memory interface structure which uses the linear memory space is described in the publication No. 231732J-003 (namely, 80386 Hardware Reference Manual) issued by Intel corp. in 1986, pages 43 to 62.

In fact, recent developments in memory system architecture of computer systems can establish high general-purpose characteristics. Conversely, very high workloads are given to a CPU with respect to accessing operations and memory managements, resulting in large overhead. Furthermore, since such a conventional computer system originally employs a memory system having a high memory capacity, a costly computer system is necessarily manufactured. These problems of the conventional computer system will now be described in more detail.

(1). In the conventional computer system, a relatively large linear memory system is required, and the processing unit is so designed that all of the linear memory system operations should be completely performed by the addressing processes and the accessing instructions. As a result, the memory space management and the accessing operation must be stated by OS or software. Then, this conventional computer system owns high general-purpose characteristics, but overhead thereof is increased.

(2). Since a total number of instructions required to access the linear memory system is increased in connection with the above-described item (1), a large quantity of memories are required to hold these instruction codes, that is, in average 10 to 12 bytes (processed by a 32-bit processor) are needed as the instruction code by executing a series of read/write operations for 1 data.

(3). When a cost-oriented industrial-purpose computer system is designed, taking account of the items (1) and (2), there is such a trend that a cost rate of a memory system to the entire computer system becomes excessively high.

(4). Although the memory system is largely occupied by such data as an instruction code series and an arranged data series (file system, numeral value process data, table, model data, etc.) which can be processed by the vector method, the conventional computer system has been designed in such a manner that all regions are accessed at random. As a consequence, the accessing operation becomes redundant, and also unnecessary overhead is required to carry out the addressing process.

(5). A critical path on the memory accessing for the computer system is controlled by a condition of how quickly the designated memory data (operand data) can be fetched into the CPU so as to be processed. If necessary data is not entered quickly into the CPU, then this CPU is brought into the waiting state, which may directly cause the processing efficiency to be lowered. In the conventional computer system, the operand data addressing is performed in the access instruction executed within the CPU. Then, the addressing result is outputted to the memory and, after the accessed target data has been read out from the memory, this data is fetched and processed, if required. As a consequence, access-waiting overhead is necessarily needed in the conventional computer system.

It could be appreciated from the above-described problems of the conventional computer system that such a computer system cannot be effectively designed to satisfy the various performance demands for a cost-oriented computer system as well as a high performance/large scaled computer system, nor can it have a uniform architecture in the future. Moreover, the cost performance matter may further cause difficulties in designing of the computer system.

These problems will now be described more in detail.

(6). When a large memory space (domain) is to be supported, a large number of address lines, a multi-bit addressing process unit such as a counter and an adder, and also an address register should be employed within a CPU. Therefore, a costly CPU would be required to satisfy such a performance, i.e., a 32-bit CPU is necessarily required (an 8-bit CPU can handle only a small address space).

(7). If hardware cost is suppressed, or lowered, then an inexpensive CPU (namely, 8-bit CPU and 16-bit CPU) must be utilized. However, the addressing process capability of such a CPU is also lowered, which implies that not only the available memory capacity is limited to a small memory capacity, but also the processing capability is reduced.

(8). Even when the cost oriented computer design could be completely requested at the present stage, in case that higher performance demands are highly expected with respect to the memory capacity and the numeral value processing capability, this computer system must be designed with high performance, to some allowable extent, taking account of properties of architecture and software utilized in this computer system.

(9). When properties and successive characteristics of a software in a computer system are considered, a program should be employed with a high-grade computer language. Accordingly, not only is the execution speed of this program lowered, but also a large memory capacity is required. Thus, cost performance of this computer system is extremely deteriorated. If performance of the computer system is improved under this condition, a higher performance capability CPU is necessarily employed, resulting in high cost of the hardware.

(10). When a high numeral value processing capability is required even under such a memory system with small memory capacity, the major portion of this performance depends upon an accessing efficiency in a memory system. As a consequence, it is required to improve the addressing capabilities to the memory system by employing a high-leveled CPU, and therefore a relatively large-scaled memory system must be designed.

(11). A combination between a high-performance machine and a program programmed on a memory system with a large memory capacity greatly depends upon OS and system software, resulting in a large code size and a large data size. In other words, since the computer system has been manufactured without taking into account the machine performance and also the memory capacity, cost performance of this computer system becomes very low. As a consequence, when this machine with such high numeral value processing capabilities is to be replaced by a cost oriented machine, a large-scaled tuning would be required (namely, a complete rebuilding is required). Furthermore, a high-grade machine is needed due to its property, which is greatly deviated from the target machine with the reasonable cost/performance.

SUMMARY OF THE INVENTION

An object of the present invention is to provide such a two-dimensionally arranged memory system with low overhead of OS and software for managing the memory system, capable of realizing high-speed memory accessing operations in the memory system having a large memory capacity. Furthermore, a total number of instructions for managing the memory system is reduced, and an overall memory capacity of this memory system can be reduced, so that overall cost can be reduced.

Another object of the present invention is to provide a memory apparatus without a linear memory system having a large memory capacity, capable of performing an addressing process and an accessing instruction process irrelevant to functions of a CPU.

A further object of the present invention is to provide a memory apparatus without requiring a large number of memories for holding an instruction code, while the number of instructions required to access the memory is reduced, and also with requiring only a limited number of instruction codes for performing a series of read/write operations for 1 data.

A still further object of the present invention is to provide such a memory system capable of executing in advance an addressing process and the like in case that overall data are largely occupied by such data as an instruction code series and an arranged data series (file system, numeral value processing data, table, model data, etc.) which can be processed in a vector manner, resulting in no useless accessing operation, and further capable of performing a high-speed accessing operation.

A still yet further object of the present invention is to provide a memory apparatus without requiring an addressing process operation in a CPU, so that access-waiting overhead becomes low, the addressed data (operand data) is quickly fetched into the CPU, and then the fetched data can be processed.

The above-described objects of the present invention can be achieved as follows:

In the memory system according to the present invention, there are provided a memory array constructed so as to perform an address designation by way of a set of a page pointer and a column pointer, a page address controller for producing the above page pointer in response to an accessing operation by a central processing unit, and a column address controller for producing the above column pointer in response to an accessing operation by the central processing unit.

The above-described column address controller includes an arrangement of a column address register file constructed of a plurality of column address register sets each set having a plurality of column address registers, and a column address counter for producing said column pointer based upon an offset address separately provided for the column and an address set from a central processing unit into said column address register file, and the above-explained page address controller includes an arrangement of a page address register file constructed of a plurality of page address registers sets each having a plurality of page address registers, and a page address counter for producing said page pointer based upon an offset address separately provided for the page and an address set from said central processing unit into said page address register file.

The above-described column address controller further includes:
a latch for temporarily storing a column pointer produced by said column address counter and a page pointer produced by said page address counter; and
control means for outputting said two pointers from said latch to said memory array by coinciding timings with each other.

The column address register file further includes an offset register constructed of a plurality of offset column address register sets each corresponding to one of said column address register sets, and a selecting circuit for performing both a selection between said column address register sets and said offset register, and another selection of the column address registers within a selected column address register set, and based on contents of the column address register selected by said selecting circuit and of the corresponding offset column address register, said column address counter produces the column pointer.

The above-explained page address register file further includes an offset register constructed of a plurality of offset page address register sets each corresponding to one of said page address register sets, and a selecting circuit for performing both a selection between said page address register sets and said offset register, and another selection of the page address registers within a selected page address register set, and based on contents of the page address register selected by said selecting circuit and of the corresponding offset page address register, said page address produces the page pointer.

Each of said plural offset registers employs a mode register, and the content of said offset register is updated by the accessing operation by said central processing unit in response to the mode set into said mode register.

There is provided a selector for selecting an output from said offset register and immediate address data derived from said central processing unit, in which said selector performs the selection between said output and said immediate address data in response to the output from said mode register.

A temporary register for first page address capable of mutually transferring data with said page address register is provided with said page address controller.

A multiplexer and a second temporary register directly accessible from said central processing unit are employed in said column address controller, and an address read by said multiplexer from said column address register file and an address set to said second temporary register are selected to be outputted.

A multiplexer and a second temporary register directly accessible from said central processing unit are employed in said page address controller, and an address read by said multiplexer from said page address register file and an address set to said second temporary register are selected to be outputted.

When the central processing unit accesses the memory system to process the arranged data, a management information used is for how the page pointer and the column pointer should be updated, and the value of the head pointer for the arranged data are set into the mode register, the page address register, and the column address register employed in the page address controller and the column address controller. It should be understood that based on the management information used when the memory array is accessed, there are provided information about whether or not the pointer should be updated to the subsequent value as the addressing process, information about whether or not the value to be updated corresponds to a value obtained by adding an offset to the present pointer, and also information about whether the value to be updated corresponds to an incremented address, or a decremented address. As a result, the addressing processes can be separately performed in a parallel mode in the page address controller and the column address controller. Furthermore, these addressing processes and the data transfer operation between the memory array and the central processing unit can be performed in a parallel mode. Accordingly, a linear memory system having a large memory capacity is not required so as to process a large quantity of arranged data, and the accessing process to the memory can be performed irrelevant to the central processing unit, so that the management of the memory space and the accessing operation are no longer stated by OS and software, and thus, overhead of this central processing unit can be greatly reduced. At the same time, since a total number of instructions required to access the memory can be reduced, it is not required to have a large capacity of memory to hold the instruction code. Thus, if the memory system according to the present invention would be applied to an industrial-purpose computer and the like, cost occupied by the memory system can be considerably reduced. Also, since the memory system according to the present invention has such a function capable of transferring and outputting the physical address derived directly from the central processing unit, the process operation for such a data requiring a random accessing operation, which is different from such a data as the arranged data having ruled characteristics, can be readily performed, so that the general-purpose characteristic of this memory system can be maintained.

BRIEF DESCRIPTION OF THE DRAWINGS

FIG. 5 shows a list of a basic instruction set for a PA controller.

FIG. 6 represents mode selecting codes for PA controller instructions WTCD5 and RDCD5.

FIG. 7 indicates a list of various functions during an issuance of a mode register set instruction.

FIG. 8 schematically represents an addressing process corresponding to contents of the mode register.

FIG. 9 schematically shows instruction set models in an assembler language of the PA (page address) controller basic instruction.

FIG. 10 schematically indicates parameter setting models in an assembler language of a bank point operation command, a mode bit set instruction, and an access instruction.

FIG. 11 shows a list of a basic instruction set of a CA (column address) controller.

FIG. 12 schematically indicates functions of right bits of a mode register.

FIG. 13 schematically represents an access instruction set for supporting the CA controller.

FIG. 14 schematically indicates an instruction set model in an assembler language of the CA controller basic instruction.

FIG. 15 schematically shows a data setting parameter model to the mode register of the CA controller.

FIG. 16 schematically represents an access instruction set model represented by an assembler language in the CA controller.

DETAILED DESCRIPTION OF THE PREFERRED EMBODIMENTS

Figure 1:
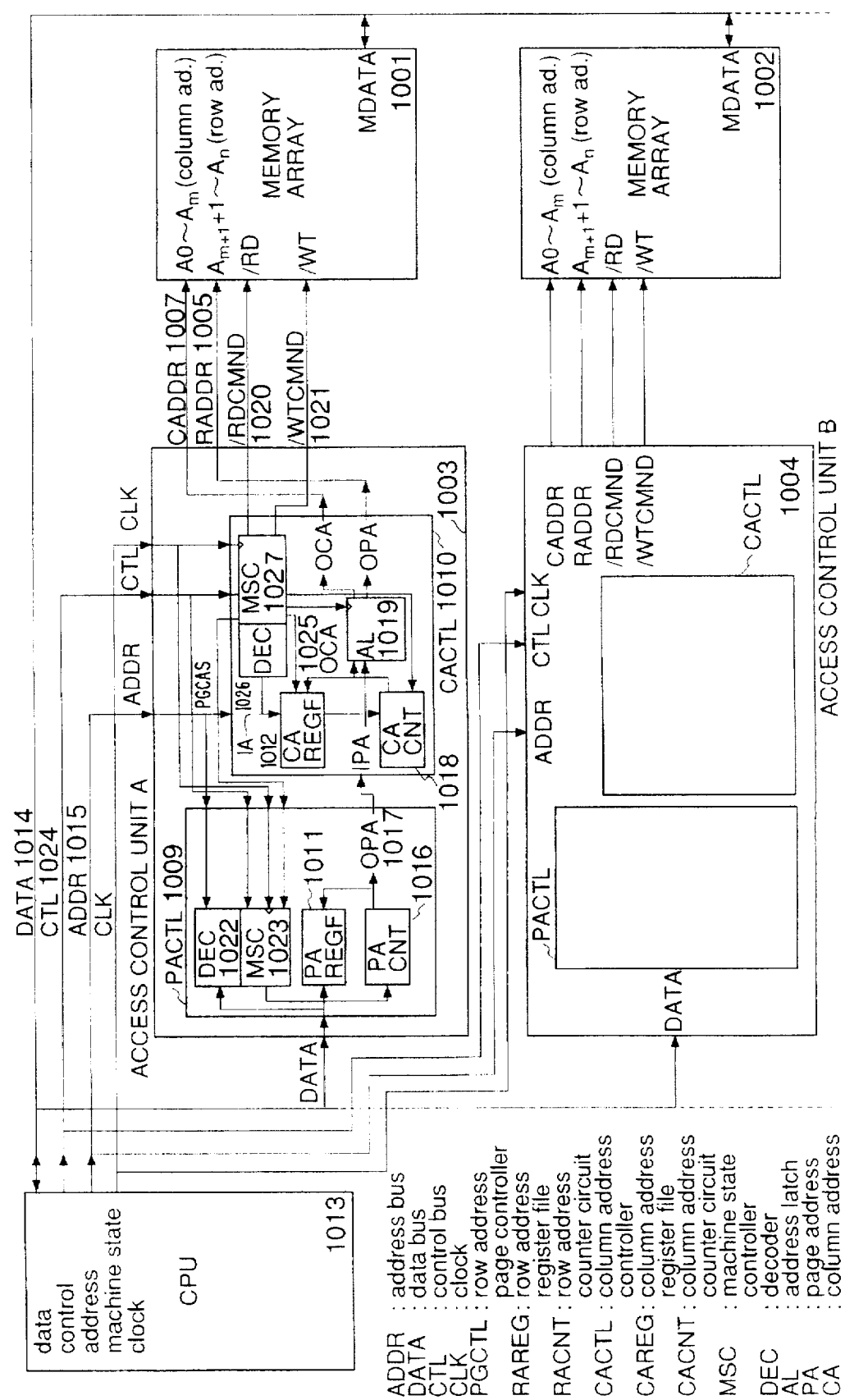
FIG. 1 is a schematic block diagram for showing a two-dimensionally arranged memory system according to an embodiment of the present invention.

Referring now to drawings, presently preferred embodiments according to the present invention will be described. FIG. 1 is a schematic block diagram for showing a two-dimensionally arranged memory system according to a currently preferred embodiment of the present invention. In the two-dimensionally arranged memory system, there are provided two access control units 1003 and 1004 with respect to a single central processing unit (will be simply referred to a "CPU" hereinafter) 1013, and two memory arrays 1001 and 1002 controlled by these access control units. In this embodiment, one of these memory arrays 1001 and 1002 is employed as a memory system for instruction code data (CDRAM), whereas the other is employed as a memory system for operand data (DDRAM) (it should be noted that either of these memory arrays may be employed as these memory systems in an opposite relation to that of the above case). The respective memory arrays may be managed, or supervised under the paging interleave access method with employment of dynamic memory elements, as described in U.S. patent application Ser. No. 08/079,852 filed on Jun. 22, 1993 now U.S. Pat. No. 5,335,336, which was a continuation of a U.S. patent application Ser. No. 07/329,306 filed on Mar. 27, 1989, now abandoned. Each of the access control units is arranged by two access management units of a page address controller (PACTL, will be referred to a "PA controller") 1009 and a column address controller (CACTL, will be referred to a "CA controller") 1010, and controls an address of the corresponding memory address by receiving a control signal, an address signal, and a data signal derived from a main CPU unit. This address is a set of a page pointer for applying a page address (address along a row direction) and a column pointer for applying a column address (address along a column direction), in accordance with the two-dimensional arrangement of the respective memory arrays.

Figure 2:
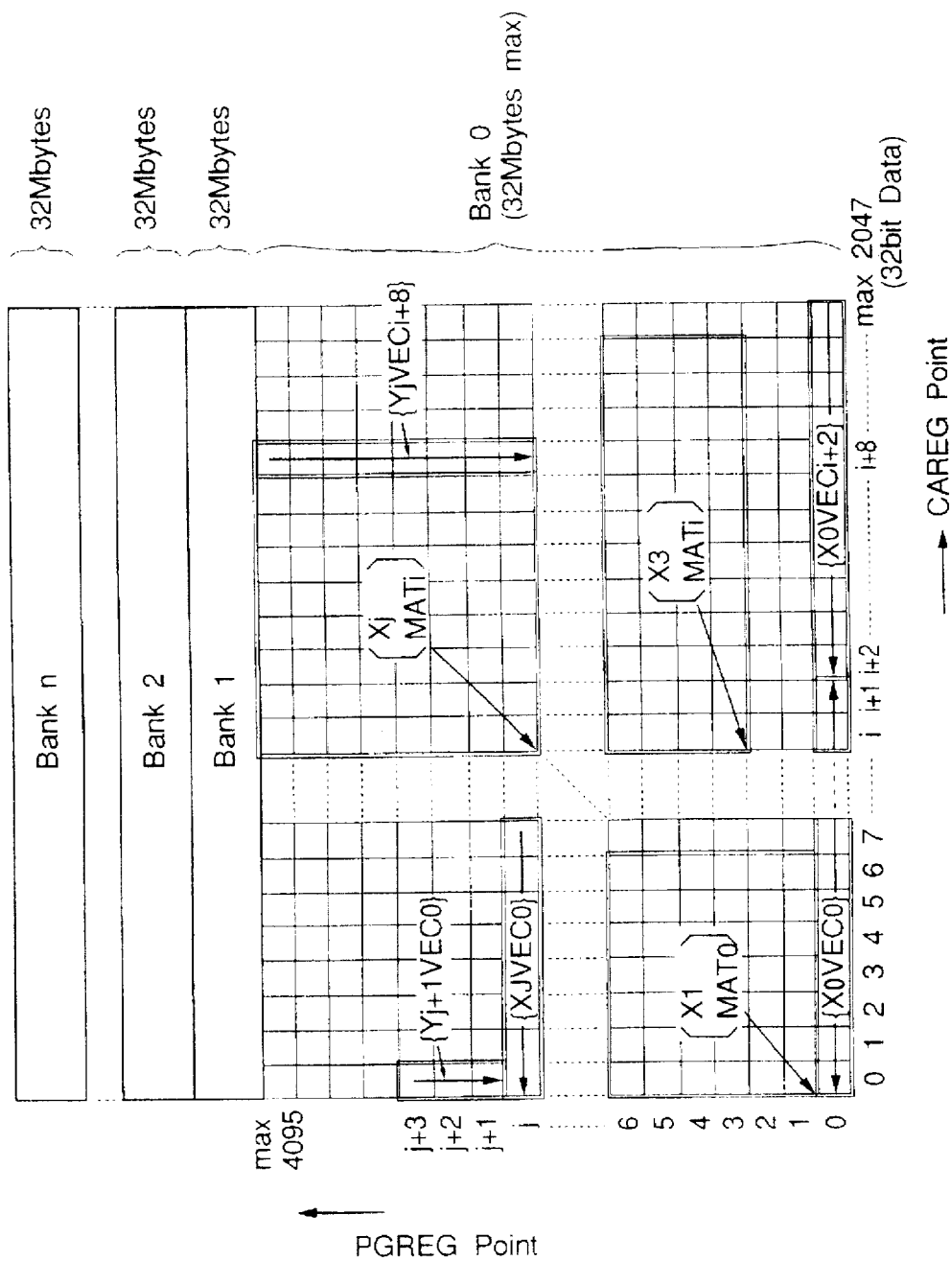
FIG. 2 is an explanatory illustration of a 1-unit arrangement of a memory array.

FIG. 2 represents an arrangement of a single unit of the memory array 1001. This memory array corresponds to such a two-dimensionally arranged memory that it is constructed of banks "0" to "n", and each of these banks has 2048 addresses that are provided as the column pointer and 4096 addresses that are provided as the page pointer. This corresponds to a capacity of 32M bytes. In this memory array, vector data are stored as a set of data into a region which starts from a location designated by a column pointer and a page pointer, that sandwich a code "VEC", such as XOVEC0 and Yj+2VEC0 as shown in FIG. 2. Row data is stored into a rectangular region which starts from a location designated by a column pointer and a page pointer, that sandwich a code "MAT", such as X1MAT0 as indicated in FIG. 2. In this way, a vector (XmVECn) and a matrix (XmMATn) are defined in the memory region. Then, attributes of multidimensional variable (corresponding to titles of arrangement) for these vector and matrix are represented as a set of page pointer "m" and column pointer "n", which indicate heads of the vector and matrix. In this embodiment, a vector along a horizontal direction is expressed as Xm VECn, a vector along a vertical direction is expressed as Ym VECn, and a matrix is represented as XmMATn, where a pointer for head data is set.

Operation of the two-dimensionally arranged memory system according to this preferred embodiment, in which the access control unit 1003 is operated, will now be explained. In FIG. 1, the main CPU unit 1013 previously supplies loop management information to the page management information to the page controller PACTL 1009 and the column controller CACTL 1010 employed in the access control unit during a process of arranged data, for instance, an execution of a vector calculating process loop at the beginning of a series of data access operation, so that the loop management information is programmed. In other words, when the main CPU unit accesses the memory array, both of information how to update the pointers "m" and "n" used for this memory array and the value of the head pointer of the arranged data stored in the memory array are set via either a data bus (DATA) 1014, or an address bus (ADDR) 1015 to the PA controller 1009 and the CA controller 1010. As a calculation process of addressing when the memory array is accessed, such information of whether or not the value of the pointer should be updated by the subsequent value, and whether the value to be updated corresponds to a value obtained by adding an offset value to the present value of the pointer, or to data obtained by incrementing or decrementing the present value of the pointer, is previously programmed, and may be executed as default addressing. Also, the main CPU unit 1013 may simultaneously instruct the memory array by utilizing the access instruction during the data accessing, so that the addressing process may be executed in conjunction with the accessing operation. These addressing processes are independently and parallelly executed by the page address counter 1016 (PACNT, will be referred to a "PA counter") employed in the PA controller 1009 and a column address counter 1018 (CACNT, will be referred to a "CA counter") employed in the CA controller 1010 with respect to the pointers "m" and "n". As a result, two pointers are automatically controlled. That is to say, the above-described process operations may fill the role of an improvement in an accessing efficiency by executing the addressing mode in which the complex addressing process executed in the conventional CPU is in advance set at the beginning of accessing operation for a series of data from the CPU, in parallel to the access operation of the CPU, based upon the loop management information and the addressing instruction (access instruction) to issue an instruction during the access operations to the respective data.

After page address data (OPA) 1017 produced in the PA controller 1009 has been once set to the CA controller 1010 as an upper address of the memory array system, this page address data together with column address data (OCA) 1025 corresponding to a lower address generated therein are latched by an address latch (AL) 1019, so that overall address data are produced. Although the page address data 1017 could be directly applied to the memory array system 1001, this direct application is not preferable. This is because a timing control for setting an output timing condition required between the column address data and the page address data is required. This is because a mode under which the physical address per se derived from the main CPU unit 1013 is directly transmitted to be outputted or transferred, is also employed in the access control unit 1003, in order that the address information characteristic as viewed from the memory array system 1001 and the output timing become equal to conditions required by the memory array system, as previously described. The timing control is carried out by once inputting the page address data to the PA controller 1010. The CA controller 1009 outputs the values of the page pointer 1005 and of the column pointer 1007, and also the control information 1020, 1021 (read information, write information, address strobe and so on) to the memory array system 1001 in such a form as to effect a direct accessing operation to the memory array 1001 from the main CPU unit 1013. In response to such access information, the memory array system 1001 executes input/output operations of the data required for the main CPU unit 1013, namely the read or write operation.

As described above, in accordance with the presently preferred embodiment, since such a complex addressing process which has been performed in the conventional CPU is executed by the access control unit coupled to the main CPU unit independent of the main CPU unit, a high-speed accessing operation can be achieved and overhead of the main CPU unit can be reduced. Among the two-dimensionally arranged memory system shown in FIG. 1, a portion corresponding to the access control unit may be fabricated in an integral circuit within the main CPU unit as one of various functions characterizing a future CPU unit (when an improvement could be achieved in integration technique of LSI, this function may be realized in a one-chip CPU). It should be however noted that there are possibilities that a separate bus system is required so as to access other subsystems and a resource, which need the normal linear access. In this case, a total number of input/output pins for the CPU unit fabricated as LSI would be increased. However, since the CPU unit may be designed in such a manner that the accessing to the arranged memory system could be performed in parallel to the accessing to other memory systems and the resource, a more high-speed accessing operation could be realized.

Subsequently, the construction and operation of the respective circuit arrangements employed in this preferred embodiment will now be described great in detail. First, as represented in FIG. 1, the page controller 1009 functioning as the management control unit of the page pointer includes a decoder (DEC) 1022 for decoding the command and the accessing operation information issued from the CPU unit 1013 thereby to analyze whether or not a command to this decoder per se has been produced, a machine state controller (MSC) 1023 for producing various control signals (command, latch trigger, etc.) and a clock signal internally used in response to the accessing operation to the CPU unit, 8 sets of page address register files (PAREGF) 1011 where 8 page address registers (PAREG, will be called as "a PA register" hereinafter) are handled as 1 set, and a page counter (PACNT, will be referred to "a PA counter") 1016 for performing the addressing calculation (addition increment and decrement) process of the PA register thereby to update the resultant value by a proper value. The setting operation of the value to the PA register is carried out in such a manner that the machine state controller 1023 writes the page data transferred from the main CPU unit 1013 via the data bus 1014 in response to the setting command sent by the control bus (CTL) 1024 for the address bus ADDR 1015.

The structure of the PA register (PAREGF) 1011 and the structure of the PA counter (PACNT) 1016 are substantially the same as those of a column address register file (CAREGF, will be referred to a "CA register file" hereinafter) shown in FIG. 3 and a column address counter (CACNT, will be referred to a "CA counter" hereinafter) indicated in FIG. 4, except for a specific circuit portion thereof (which will be discussed later). A detailed description will be made with respect to the CA controller, and a simple explanation will now be made as follows. That is, the PA register file 1011 is arranged in such a manner that 8 page address registers (PAREG<will be referred to a "PA register") constitute one set of bank, and 8 sets of banks are prepared for this PA register file 1011. A value to determine which PA register among the eight PA registers should be selected is called "a stack address", whereas a value to determine which bank among the 8 sets of banks should be selected is called "a bank address". These two address values are produced by a stack address counter and a bank address counter. One PA register to be used is selected based upon the bank address and the stack address, and then the page pointer is determined based on the value of this selected PA register.

The PA counter (PACNT) 1016 owns such a function for performing an addressing process designated with regard to the selected PA register. There are four processes in the basic addressing process, i.e., PAREG←PAREG+OFFSET, PAREG←PAREG+1, PAREG←PAREG−1, and PAREG no change. As the OFFSET value, the value of the offset register employed with respect to each bank set of the PA register is normally utilized, but immediate data may be directly supplied from the main CPU unit 1013.

In the above-described arrangement of the PA controller, the management of the loop nest during the vector process operation and the management of the complex loop process which requires a plurality of page pointer variables within the same leveled loops are realized by operating the bank address counter. Instructions to execute this operation are called an "Increment Stack Point" and a "Decrement Stack Point". The main CPU unit 1013 can manage a plurality of pointer variables by changing the page pointer with employment of these instructions within the loop process. Also, such an instruction is prepared by which an operation instruction of the stack counter is combined with a data load operation or a data store operation from the main CPU unit 1013 to the PA register, and both of these operations are executed at the same time.

FIG. 5 represents a basic instruction prepared in the PA controller 1009. In FIG. 5, symbols WTCD0, WTCD1, WTCD3, WTCD6 and symbols RDCD0, RDCD1, RDCD3, RDCD6 denote instructions related to data load operation and data store operation to the PA register (PAREG), and also a change of operation of a stack address, whereas symbols WTCD5, WTCD7, RDCD5 and RDCD7 represent a change of operation of a bank address. Both of an implementation method for the instructions shown in FIG. 5 in the assembler language, and a description method for an application software employing the assembler language will be described in greater detail.

On the other hand, the management control unit (CA controller) 1010 for the CA pointer is operated in response to the instruction and the accessing operation information supplied from the CPU unit 1013 and the accessing operation itself in a similar manner to the PA controller 1009. The CACTL (management control unit) 1010 includes a decode circuit (DEC) 1026 for decoding the above-described information, a machine state controller (MSC) 1027 for producing various control signals (command, latch trigger, etc.) and a clock signal internally used in response to the access operation of the main CPU unit, column address register files (CAREGF, will be called as a "CA register file") 1012 in which 8 column address registers (CAREG, will be referred to a "CA register") are combined as 1 set, and 8 sets of CA registers are prepared, a CA counter (CACNT) 1018 for executing an addressing calculation (addition, increment, and decrement) of the CA register, thereby to update the value of the CA register by a proper CA point data value, and an address latch (AL) 1019 for combining page point data sent from the PA controller 1009 with CA point data generated in the CA controller 1010, thereby to produce address data to be supplied to the memory array system.

A basic operation of this CA controller is essentially identical to the major operation of the PA controller 1009. To execute an access instruction, it is required to set the addressing condition to the CACTL, and to set a start address and an offset value before data transfer operations between the CPU and the memory array are sequentially carried out. To previously set the command of this basic instruction into the CACTL, the address bus (ADDR) 1015 and the control signal (CTL) 1024 derived from the main CPU unit 1013 are utilized, and the data bus (DATA) 1014 of the main CPU unit 1013 is used or assigned to the subsequent transfer process of the real data (namely, data to be processed by the main CPU unit 1013), so that the command instruction process to the CA controller 1010 is operated in parallel with the transfer process from/to the memory array, and therefore access overhead can be reduced as much as possible. Since there are great possibilities that the column pointer 1007 is accessed by the main CPU unit 1013 at random, it is required to set the addressing process at a high efficiency. The command of the instruction to PACTL may be transferred by employing the data bus as represented in FIG. 1. To the contrary, a high-speed accessing operation can be achieved by transferring the command of the instruction to CACTL with employment of the address bus. In particular, when the main CPU unit 1013 accesses the memory data, the function to designate the calculation mode for the addressing operation at the same time becomes important, and instructions to realize these functions are called as an "access instruction". It should be noted that before the access operation is actually commenced, a head address for indicating which place within the memory array is accessed, and an offset value for the address addition are first of all set. If the access operation would be carried out by utilizing the access instruction, then the data of the memory address indicative of the pointer at this time could be transferred at the normal access overhead. At the same time, a pointer corresponding to an address value to be subsequently accessed is calculated by the CA counter 1018 employed within the CA controller 1010 in parallel to the above-described data transfer operation. Upon completion of the access operation, the content of the CA register 1012 presently designated is immediately updated by this value.

Figure 3:
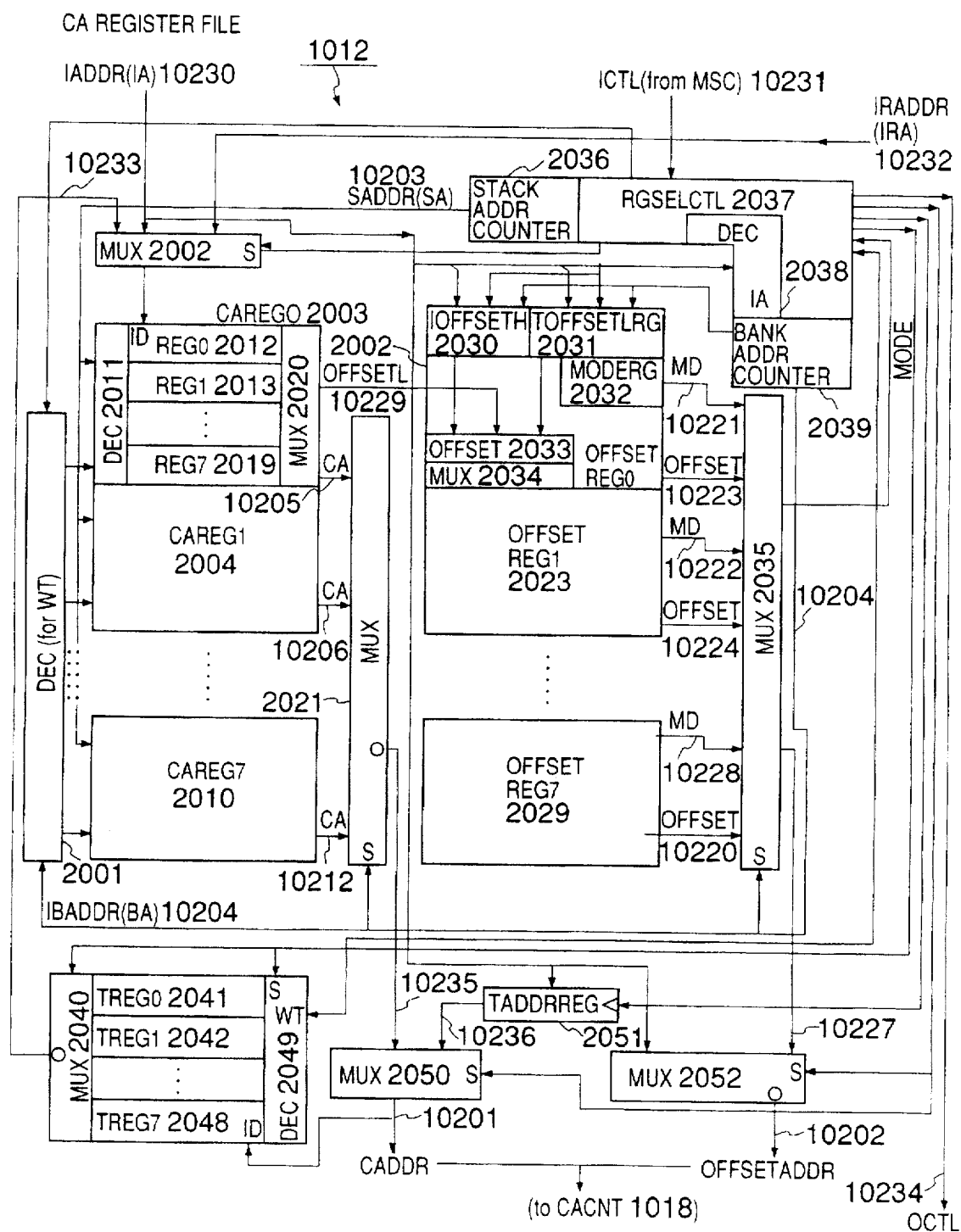
FIG. 3 is a schematic block diagram for representing an example of a construction of a column address register file (CAREGF).

FIG. 3 represents a construction of the CA register file (CAREGF) 1012. The construction of the CA register file 1012 is substantially identical to that of the above-described PA register file 1011. If a column address (CA) would be replaced by the page address (PA) in the description of this CA register file, the same explanations about the corresponding circuit portions may be utilized as those of the PA register file. In FIG. 3, the CA register file 1012 owns 8 sets of CA registers (CAREG) 2003 to 2010 and 8 sets of offset registers (OFFSETREG) 2022 to 2029, and one pair of a single CA register set (positioned at left and right positions in FIG. 3) and a single offset register constitutes a so-called "register bank (register banks 0 to 7)". Furthermore, a single CA register set is arranged by 8 CA registers (REG0 to REG7) 2012 to 2019. A value of the CA pointer is obtained by adding in the CA counter 1018 of FIG. 1, a column address value (CADDR) 10201 and an offset value (OFFSET ADDR) 10202, which are outputted from the CA register set and the offset register that constitute a single register bank. Then, in accordance with the normal usage method, a single CA register set is allocated to either a single calculation loop, or a single calculation tank (or job). Each of loop processes for constituting a plurality of loops or a multiple loop executed in this CA register set is managed by employing one or plural CA registers within this relevant CA register set. A selection of 8 registers within the respective CA register sets is performed by decoding a stack address (SADDR) 10203 outputted from a stack address counter (STACKADDRCOUNTER) 2036 employed in a register selecting circuit (REGSELCTL) 2037 by a decoder circuit (DEC) employed in the respective CA register sets. A selection of the register banks 0 to 7 is executed by using a bank address (BADDR) 10204 outputted from a bank address counter (BANKADDRCOUNTER) 2039 within the register selecting circuit 2037. 8 stack addresses corresponding to the relevant register bank are contained within the stack counter 2036. When the bank address 10204 is changed, the stack address 10203 is similarly changed into one corresponding to this bank address. The stack address counter 2036 instructs a selection process of the CA register (corresponding to PUSH, POP functions) employed within the selected register bank via a SADDR 10203 signal by incrementing/decrementing the selected stack pointer.

To select the register banks 0 to 7, a selection of the CA register sets 2003 to 2010 and a selection of the offset register are required. Among these selections, the selection of the CA register set is performed in such a manner that a decoder for writing process (DEC for WT) 2001 decodes the bank address 10204 to designate the CA register set to be written during the write operation to this register set, and a selection input S of a multiplexer (MUX) 2021 for selecting the column addresses (CA) 10205 to 10212 is designated by the bank address 10204 during the read operation from this CA register set. On the other hand, the selection of the offset register set is carried out in such a way that a selection input S of a multiplexer (MUX) 2035 for instruction read operations of offset data (OFFSET) 10213 to 10220 and mode data (MD) 10221 to 10228 is designated by the bank address 10204.

Each of the offset registers 2022 to 2029 includes two temporary offset registers (TOFFSETH) 2030 and (TOFFSETLRG) 2031 and a mode register (MODERG) 2032. The offset data may be constructed by either merging (indicated by mark:) a value of an offset field within the data about the selected CA register employed in the corresponding CA register and a value of the temporary offset register (TOFFSETH) 2030 into a lower portion and an upper portion as OFFSET=TOFFSETH: OFFSETL, or by the two temporary offset registers as OFFSET=TOFFSETH: TOFFSETLRG, which is selected by the multiplexer 2034. One of thus constructed offset data 10213 to 10220 is defined as an output value of the relevant offset register, which is selected by the multiplexer 2035 and then becomes an offset address 10237 and, furthermore, is sent via the multiplexer 2052 to the CA counter 1018 as an offset address (OFFSET ADDR) 10202. This offset address 10202 can be directly designated by an address input (IADDR) 10230 derived from the main CPU unit. In other words, upon designation of the external designation mode by a control signal (ICTL) 10231 supplied from the machine state controller 1027, the register selecting circuit 2037 operates the selection input S of the multiplexer (MUX) 2052 and sends directly the value of IADDR 10230 to the CA counter 1018 as an offset address 10202. As will be described later, a mode register (MODERG) employed in each of these offset registers is utilized so as to define the various sorts of operation modes (access mode, addressing mode and so on) while this CA register is utilized. The data of this register 2032 is supplied to the multiplexer (MUX) 2035, and the register selecting circuit (RGSELCTL) 2037 produces a proper state based on this information in response to the accessing operation of the main CPU unit 1013.

Other than the above-explained bank registers, there is provided a temporary address register (TADDRREG) 2051 in order that temporary data designated by the main CPU unit 1013 via the IADDR 10230 may be utilized as a column address 10201. Also, there are employed 8 temporary storing registers (TREG0 to TREG7) 2041 to 2048 in order to proceed with the process operation in such a manner that when the present value of the column address 10201, namely, the presently selected CA register or temporary address register, is temporarily utilized for other usage, this value is temporarily copied, and the copied data is later reproduced. As an operation instruction of this temporary register, an EXCHANGE instruction is provided for exchanging a load/store instruction between an arbitrary temporary register and the presently selected CA register, into contents of an arbitrary TREG and the presently selected CAREG. These instructions related to the operations of the temporary register are designated by the main CPU unit 1013, and a state required for the register selecting circuit 2037 is produced and executed.

All of the states of the CA register are managed by the register selecting circuit 2037. The register selecting circuit 2037 makes a decision on the state of the CA register file 1012 by wholly considering the control signal (ICTL) 10231 of the machine state controller 1027 which monitors the operations of the main CPU unit 1013, the address input (IADDR) 10230 from the main CPU unit 1013, and the MODE information from the mode register. The register selecting circuit 2037 also produces a required sequence containing the address processing operation in response to the accessing operation of the main CPU unit 1013 to the memory array. The functions of the above-described register selecting circuit will now be summarized.

(1). The register selecting circuit 2037 monitors the accessing operation from the main CPU unit 1013 to the memory array based upon the information from the machine state controller (MSC) 1027 and the information of the address input IADDR 10230 from the main CPU unit 1013, and outputs various switch signals (selecting signals of MUX), a write signal WT to the register file, and address signals to the respective decoders in response to this accessing operation.

(2). A decoding operation of an instruction derived from the main CPU unit 1013 is carried out by the decoder circuit employed in the register selecting circuit 2037 by utilizing the address input (IADDR) 10230 and the control signal (ICTL) 10231 from the machine state controller 1027, so that the register selecting circuit discriminates from the instruction gives and executes the corresponding process operation.

(3). The register selecting circuit 2037 manages the stack address counter 2036 and the bank address counter 2039, and produces stack addresses 10203 for selecting the register (REGn) within the CA register set and also the CA register set and the offset register to be used.

(4). The register selecting circuit outputs a selection signal S of the temporary register (TREG) file, a data write signal WT to the selected TREG, and a selection signal of TREG to be read, in which two of the above-explained selecting signals may be produced at the same time (used for the EXCHANGE instructions and the like). The load/store EXCHANGE instructions are executed for the arbitrary TREG by utilizing these output signals.

(5). As to the controls of the multiplexer (MUX) for controlling the data flow, the following functions are defined:

(a). A selection is made whether external address data (IADDR) 10230 is employed as a data input (ID) to the CA register set, whether the data issued from the temporary registers 2041 to 2048 is employed, or data IRADDR 10232 obtained after the addressing calculation process has been added by the CA counter.

(b). A selection is done in which the CA register set and offset register set are utilized.

(c). A selection is made whether the value of the presently used CA register 10235 is employed, or the value of the temporary address register 10236 is utilized as the column address 10201.

(d). A selection is made whether the value of the output 10237 of the presently selected offset register, or the external address data (IADDR) 10230 is used as the offset address 10202.

(6). The register selecting circuit 2037 outputs a control signal and a selection signal (these signals being combined with each other as OCTL 10234) to the CA counter 1018.

(7). The register selecting circuit determines the stack address to be processed by the stack address counter 2036 in the increment/decrement (INC/DEC) process by employing the bank address 10204 from the bank address counter 2039, which corresponds to the relevant bank register set.

(8). The multiplexer (MUX) 2002 is set to such a mode that return address data (IRA) 10232 derived from the CA counter 1018 after the addressing calculation process is inputted to the CA register, and the IRA 10232 is immediately written into the CA register after the present accessing operation from the main CPU unit 1013 into the memory array 1001 has been accomplished. As a result, a vector type addressing process (CAREG=CAREG+OFFSET) in connection with the offset addition by the CA counter 1018 is executed.

Figure 4:
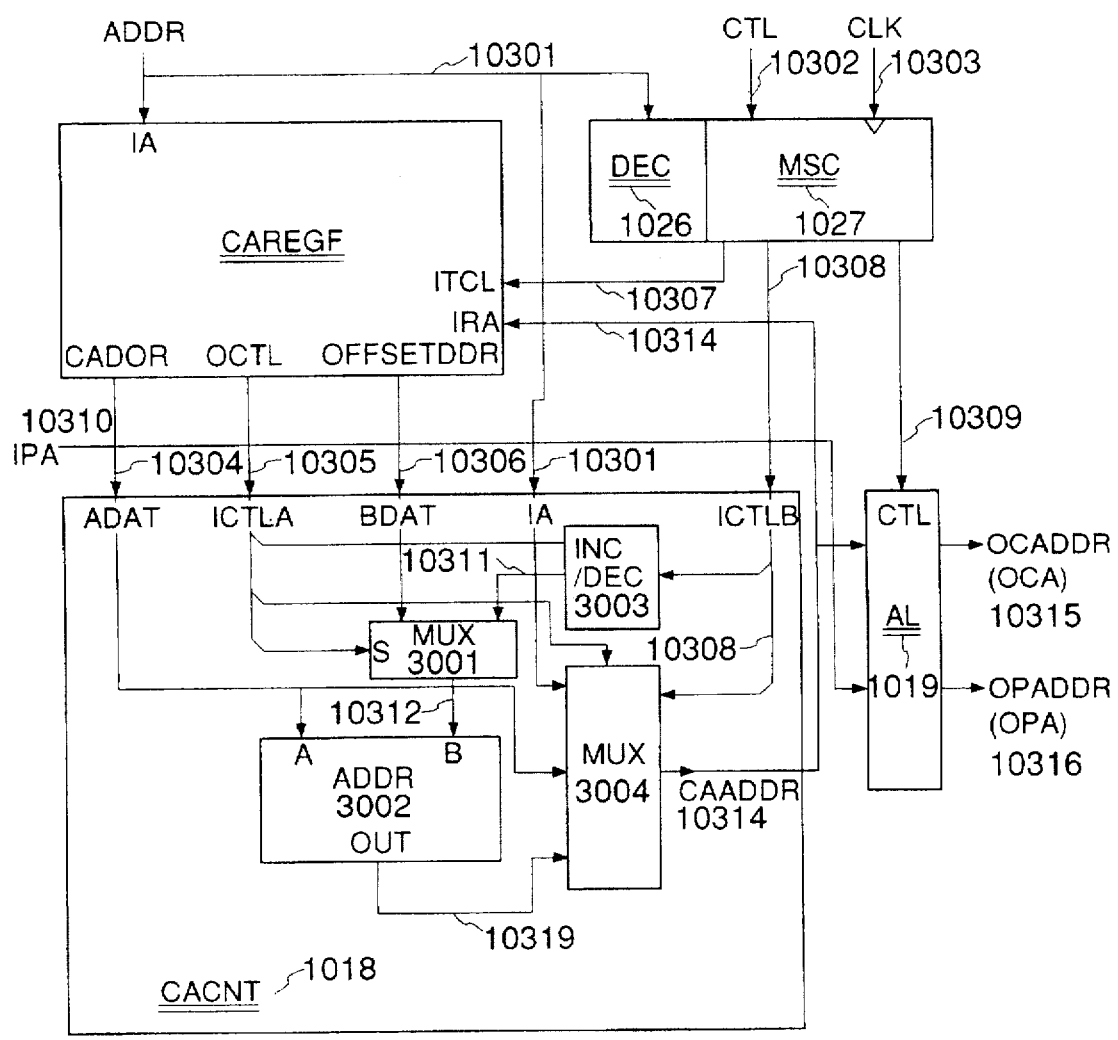
FIG. 4 is a schematic block diagram for indicating an example of a construction of a column address counter (CACNT).

In FIG. 4, there is shown a circuit block diagram of the CA counter (CACNT) 1018 (which is similar to the PA counter). Basically, this CA counter generates a column access address (CAADDR) by adding the column address 10304 to the offset address 10306, which have been sent from the CA register file 1012, or by adding +1 (INCREMENT) or −1 (DECREMENT) to the column address. As a control signal for this CA counter, both an ICTLA control signal 10305 by receiving the OCTL 10234 outputted from the register selecting circuit 2037 (included within the CA register file 1012), and an ICTLB control signal 10308 directly outputted from the machine state controller (MSL) 1027 are used. The ICTLA control signal 10305 mainly defines the states (the selecting condition of the multiplexer, and the selecting condition of the addressing mode), whereas the ICTLB control signal 10308 mainly defines the operation timings of the CA counter 1018. The operations are explained as follows:

First, an adder (ADDR) 3002 adds data to be added (ADAT) 10304 inputted into "A" with an address offset value inputted into "B" to output a result 10319. As the address offset value 10312, BDAT 10306 by receiving the offset address from the CA register file 1012 and data (1 for INC, −1 for DEC) derived from the INC/DEC circuit 3003 are switched by a multiplexer (MUX) 3001 to be utilized. A final value of the column access address (CAADDR) 10314 is determined by selecting by the multiplexer 3004 the output 10319 from the adder 3002, the column address value (ADAT) 10304 from the CA register file 1012, and one of address data (10301) externally directly supplied. The determined value is returned to the IRADDR (IRA) 10314 of the CA register file 1012 and is latched by an address latch (AC) 1019. The address latch 1019 latches the page address data (IPA) 10310 sent from the PA controller 1009 at the same timing as that at which CAADDR 10314 is latched, and produces an overall address OPADDR 10316: OCADDR 10315 to be applied to the memory array. The latch timing to the address latch 1019 is properly controlled by a latch control (CTL) 10309 derived from the machine state controller 1027. As a consequence, when being viewed from the external memory system, an observation is made in such a manner that a series of memory address signals corresponds to the address signals directly sent from the main CPU unit 1013. When the address signal derived from the main CPU unit 1013 is directly used as OCADDR 10315, the selection signal S may be set in such a manner that the multiplexer 3004 selects the external address (ADDR) 10301.

As previously explained, the INC/DEC circuit 3003 instructs an adder 3002 to perform either an increment addressing operation, or a decrement addressing operation by giving +1 or −1 to the address offset value. An instruction to the INC/DEC circuit 3003 is carried out by changing the mode (namely, to determine either the INC mode, or the DEC mode) in response to the selection signal 10305 derived from the register selecting circuit 2037 within the CA register file 1012, and the timing signal derived from the machine state controller 1027.

As the mode designating method of the addressing process by the CA counter, there are a method for previously selecting the addressing mode by the mode register employed in the CA register file 1012, and another method for simultaneously selecting the addressing mode and the accessing to the memory address when the access command is instructed. The timing at which the processed address is latched into the address latch 1019 is effected just after the accessing operation to the memory address 1001.

FIG. 11 represents a basic instruction set prepared for the CA controller 1010. The CA controller 1010 employs the substantially the same structure as that of the PA controller 1009, but additionally utilizes a temporary register operation instruction, and an instruction by which the data PUSH/POP instruction to the CA register and the addressing process are combined with each other and the combined instructions are executed at one time. Also, as represented in FIG. 5, such a direct access instruction is listed that the data accessing process and the addressing process containing the mode selection are combined with each other, and the combined instruction is performed at one time. With respect to the instructions of the CA controller 1010, the implementation method in the assembler language, and the description method for the application software will now be described in detail.

In response to an instruction issued from the main CPU unit to the access control unit, the two-dimensionally arranged memory system supports both the various vector type accessing functions from the main CPU unit to the memory array and the normal scalar type random accessing function. As previously explained, when the vector type accessing function is executed among these accessing functions, the hardware function of the access control unit is effectively operable. An instruction set for concretely executing these functions may be utilized on the program in a partially merged form into the own instruction set, as viewed from the main CPU unit, with mixture of the normal instruction of the main CPU unit. All of operation instructions for the two-dimensionally arranged memory system are substituted by the data transfer instruction (MOV instruction etc.) effected between the main CPU unit and the specific address region, and the resultant instructions are combined with other instruction sets of the main CPU unit. As a consequence, the specific functions (functions of two-dimensionally arranged memory system) instructed by either the address line, or the data line are realized in this memory system in addition to the function of the normal data transfer instruction by which only the data transfer operation between the resource and the register is realized.

There are provided two sets of instructions, namely, one instruction for the PA controller and the other instruction for the CA controller, in a single access control unit. Also, the sets of instruction are independently prepared, the quantity of which is equal to the number of units employed in the access control unit existing within the memory system. In case of this memory system, it is possible to independently issue instructions to the access control units 1003 and 1004. A detailed explanation will now be made with reference to the instruction set list.

First, a description will now be made of an instruction set and an implementation to the assembler language to the PA controller. The PA controller controls the parameter "m" (page pointer) along the column direction of the two-dimensional arrangement (m, n). Although the arrangements of the PA register set and the offset register set and also the number of bank register sets are similar to those of the CA controller, no temporary file is presently equipped. The reason why the PA controller owns less hardware functions than those of the CA controller should be understood. That is, generally speaking, since the parameter along the column direction is used to manage the outer loop (i.e., loop at shallow nest side), overhead to control the column-direction parameter is sufficiently small with respect to the overall processing time, as compared with overhead to control the row-direction parameter. As a result, the instruction set of the PA controller is reduced, that is, it is made compact, with respect to the instruction set of the CA controller (as will be described later). Furthermore, the PA controller is not equipped with such a direct access instruction for realizing, though one instruction, both the accessing operation by the main CPU unit and the addressing process containing the selection of the addressing mode in a parallel form. The accessing operation from the main CPU unit to the memory array is first managed at the side of the CA controller, and the addressing process of the column-direction parameter is instructed in response to a signal (OPGCAS) for initiating the PA controller, if required. Accordingly, the basic accessing management to the memory array is carried out at the side of the CA controller, and the PA controller is operated as a slave unit thereof.

FIG. 5 shows a basic instruction set of the above-explained PA controller. The basic instruction designation is performed based on decode information CSN of an address to which the PA controller has been assigned, byte access enable signals BE1N to BE3N, and a read/write designation signal W/R. When this basic instruction of the PA controller is classified in view of instruction functions, the following functional instructions are given:

| (PA1) | Operation instruction of PA register (PAREG). |
|---|---|
| WTCD1 | load data (DT) from external unit to PA register. |
| WTCD0 | After stack pointer of PA register is incremented, load data (DT) from external unit to PA register. |
| RDCD1 | After stack pointer of PA register is decremented, store data (DT) from PA register into external unit. |
| (PA2) | Operation instruction of offset register (OFFSETREG). |
| WTCD4 | load data (DT) from external unit to offset register. |
| RDCD4 | store data (DT) from offset register to external unit. |
| (PA3) | Operation instruction of stack pointer (value of stack address counter). |
| WTCD3 | load data (DT) from external unit into stack pointer. |
| RDCD3 | store data (DT) from stack pointer into external unit. |
| (PA4) | Operation instruction of either bank pointer (value of bank address counter), or mode register (as to D22 and D23, a description will be made in FIG. 6). |
| WTCD5 | load data (DT) from external unit into bank pointer (D22=0, D23=0). |
| RDCD5 | store data (DT) from bank pointer to external unit. |
| MODE | set mode (D22=1, D23=0) |
| | It should be noted that functions of mode bit set by this mode set instruction have been explained with reference to FIGS. 7 and 8. |
| | (WTCD5) set external address (D22=0, D23=1), and reset software (D22=1, D23=1). |
| (PA5) | Instruction of incrementing (PVSH)/decrementing (POP) stack pointer. |
| WTCD6 | STACK POINT (SP) = SP+1 (PAREG PUSH, INCrement) |
| RDCD6 | STACK POINT (SP) = SP−1 (PAREG POP, DECrement) |
| (PA6) | Instruction of incrementing (PUSH)/decrementing (POP) bank pointer. |
| WTCD7 | BANK POINT (BP) = BP+1 (BANK PUSH, INCrement) |
| RDCD7 | BANK POINT (BP) = BP−1 (BANK POP, DECrement) |

FIG. 6 indicates a mode selection in case of the above instructions WTCD5 and RDCD5. Four (4) sorts of write commands WTCD5 may be selected by employing D22 and D23 bit in the data bus (DATA). When the read command RDCD5 is issued, the present value of the bank address can be continuously read out.

An instruction required for transferring/receiving data to/from an external unit (this external unit points to main CPU unit in almost all cases) among the above-described instructions (PA1) to (PA6) executes a communication of necessary data (DT) between external unit (ex. main CPU unit) and PACTL (1009) via the data bus (DATA). Above mentioned condition is applied to instructions PA1–PA4 in this example. At this time, a byte enable/BEn indicative of an effective byte on the data bus, which becomes active (0), holds effective data in the data input/output with the PA controller (in this memory system, since a 32-bit bus is initially provided, 4 byte enables BE0 to BE3 for 4 bytes are present). However, as stated above, with respect to the mode selection shown in FIG. 6, since the data bits D22 and D23 are used as the function selecting signals, effective data bits are D16 to D21, namely 5 bits. Assuming now that the data bit D16 is bit 0 and the data bit D21 is bit 5, functions which are defined when the set instruction of the mode register (Set Operation Mode D22=1, D23=0) is issued, are represented in FIG. 7. Based on this instruction, various addressing modes and functions are defined. When the main CPU unit accesses the memory array, the designated function is executed in response to the PGCAS signal derived from the CA controller.

FIG. 8 represents how such an addressing process that the PA register is used as a destination register is executed in response to an access of the main CPU unit by designating the respective mode bits of the mode register 2032 (shown in FIG. 3). There are typically two conditions: when the main CPU unit executes an access to the main array and the CA controller causes the PGCAS signal to be active, the designated addressing process is performed, and the value of the PA register is updated (Access and PC Change), and also the value of the PA register is not updated under the same condition.

Then, a description will now be made of an implementation of the PA control command set into the assembler language. This may be replaced by the data transfer instruction (for instance, MOV instruction) irrelevant to the forms of the main CPU unit. The data transfer instruction is such a common instruction which is necessarily present in this instruction even when any types of CPUs are employed independent from the generation and sort of the CPU. As a consequence, it may be asserted that transplantation and asserts of the PA controller instruction set (common to the CA controller instruction set) are very high.

In FIGS. 9 and 10, there are shown a concrete example of instruction registering process to the assembler language. In this case, a description will now be made of such a condition that either i 8086 CPU, or i 80X86 CPU, which are manufactured by Intel Inc, USA is employed as the CPU. The instructions of the PA controller may be expressed by coinciding a parameter (address label) title indicative of an address value to which an instruction has been assigned with an instruction mnemonic. FIG. 9 indicates an instruction set model of the basic instruction in the assembler language. The description method when the instruction set model is actually used in the program is given as follows:

TACTLx ES:[Inst.], AX(or AL) for WRITE

RACTLx AX(or AL), ES:[Inst.] for READ

It should be noted that symbol "x" indicates a parameter for discriminating a plurality of PA controllers from each other, x=0 is assigned to the access control unit 1003 and x=1 is assigned to the access control unit 1004 in this memory system. On the other hand, FIG. 10 shows parameter setting models for a bank point operation instruction, a mode bit set instruction, and an access instruction expressed in the assembler language. The instruction expressions are given as follows:

RACTLx ES:[MDSET], Parameter+Data (DT) for WRITE

PACTLx ES:[BPSET], Parameter+Data (DT) for WRITE

PACTLx AL, ES:[BPRD] for READ

The address labels MDSET, BPSET and BPRD have the same value of SETMD shown in FIG. 9, and are employed for the sake of easy understandable mnemonic. Symbol "MDSET" denotes a mode bit setting instruction, symbol "BPSET" shows a base pointer set, and symbol "BPRD" represents a base pointer read. It should also be noted that symbol "ES" is a statement for designating a segment (ES) in the i 80X86 system CPU. Since a series of instructions (Inst.) are arranged in the segment indicated by the ES segment register for the sake of convenience in this preferred embodiment, this statement is required. However, this statement is not essentially required in the memory system.

Subsequently, a description will now be made of an instruction set for the CA controller and an implementation into the assembler language. The CA controller controls the parameter "n" (column pointer) of the two-dimensional arrangement "A" (m, n) along the column direction. Different from the PA controller, this CA controller employs no specific address area to which an instruction is assigned, but instead thereof employs such a method for assigning an address space to produce an instruction with overlapping an address space to which the memory array has been assigned, as viewed from the main CPU unit. A concrete method is given as follows:

a). The accessing methods from the main CPU unit to the memory array with respect to a specific address region are limited to two sorts of accessing methods, i.e., a double word (32-bit) accessing method and a word (16-bit) accessing method. In other words, the byte access into the memory array in this specific region, the double word access extending over the double word boundary, and the word access extending over the word boundary are invalidated, and these access modes are assigned as instructions to the CA controller.

b). In this memory system, the specific address region described in the item a) corresponds from $(0000000000000)_2$ to $(111111111111)_2$ during the byte access and the double word access, namely all region, and also corresponds from $(1110000000000)_2$ to $(111111111111)_2$ during the word access.

The parameter setting operation to the internal register is performed by employing the address bus (ADDR), and either the values of the data written into the internal register, or the states of the internal register cannot be directly read out similar to the PA controller (although it is possible to read such data if the circuit arrangement would be specifically designed, there is no specific merit because the temporary register file is internally provided). There are the below-mentioned merits when such an instruction assign method is employed.

1). Since the data bus (DATA) is not required to issue an instruction, both of a transfer process of target data with employment of the data bus between the memory array and the main CPU unit, and an instruction generation process to the CA controller can be executed at the same time in a parallel mode.

2). No extra memory space used to assign an instruction is required. Since a single instruction set for CA controller continuously corresponds to a single memory array, this merit can be continuously achieved even when more memory arrays are provided.

In FIG. 11, there is shown a basic instruction set for CA controller. An instruction designation is carried out by address bits A2 to A12, read/write designation signal W/R, and byte access enables BE0N to BE3N. It is possible to designate an instruction to the CA controller in a time period during which the address space assigned to the corresponding memory array is accessed (which is equal to a role of the CSN signal when an instruction is designated to the PA controller). The functions of the instructions are classified as follows:

| (CA1) | Operation instruction of CA register (CAREG). | |
|---|---|---|
| | WTCD0 | load data (DT) from external unit to CA register. |
| | WTCD1 | after stack pointer to CA register has been incremented, load data (DT) from external unit into CA register. |
| | RDCD0 | after stack pointer to CA register has been decremented, load data (DT) from external unit into CA register. |
| | RDCD1 | add externally supplied immediate data (Imm. Data) to present value of CA register, and return added value to CA register. |
| (CA2) | Operation instruction of offset register (OFFSETREG). | |
| | WTCD2 | load data (DT) from external unit to offset register. |
| | RDCD2 | add externally supplied immediate data (Imm. Data) to present value of offset register, and return added value to this offset register. |
| (CA3) | Operation instructions of stack pointer (value of stack address counter) and bank pointer (value of bank address counter). | |
| | WTCD3 | load data (DT) from external unit to stack pointer. |
| | RDCD3 | load data (DT) from external unit to bank pointer. |
| (CA4) | Instructions of incrementing (PUSH)/decrementing (POP) stack pointer. | |
| | WTCD12 | STACKPOINT (SP) = SP + 1 |
| | RDCD12 | STACKPOINT (SP) = SP − 1 |
| (CA5) | Instructions of incrementing (PUSH)/decrementing (POP) bank pointer. | |
| | WTCD13 | BANKPOINT (BP) = BP + 1 |
| | RDCD13 | BANKPOINT (BP) = BP − 1 |
| (CA6) | Instructions of setting mode register/addressing mode. | |
| | WTCD4 | set mode register (see FIG. 12). |
| | RDCD8 | set address bus equivalent mode (directly output external address to memory array) |
| | RDCD9 | set adding address mode. (CAREG=CAREG+OFFSETREG) |
| | RDCD10 | set increment address mode. (CAREG=CAREG+1) |
| | RDCD11 | set decrement address mode. (CAREG=CAREG−1) |
| (CA7) | Instruction of setting system mode. | |
| | WTCD14 | set temporary address register mode (select temporary address register instead of CA register). |
| | RDCD14 | partial reset (initialize stack pointer and set default value to mode register). |
| | WTCD15 | set no change mode of CA register. |
| | RDCD15 | set software of CA controller (equivalent function to hardware reset). |
| (CA8) | Instruction of operating temporary register. | |
| | WTCD16 | store content of CA register into temporary register "n". |
| | WTCD17 | load content of temporary register "n" into CA register. |
| | WTCD18 | exchange content of CA register into content of temporary register "n". |
| (CA9) | PA controller initiating instruction/addressing execution instruction with stack operation. | |
| | WTCD19 | output active PGCAS signal into PA controller (initiation of PA controller). |
| | RECD16 | SP=SP−1, CAREG=CAREG+1 (CAREG POP and CAREG INC) |
| | RECD17 | SP=SP−1, CAREG=CAREG−1 (CAREG POP and CAREG DEC) |
| | RDCD18 | SP=SP−1 CAREG=CAREG+OFFSETREG (CAREG POP and CAREG ADD) |
| | RDCD10 | SP=SP−1, CAREG=CAREG+Imm. (CAREG POP and CAREG Imm. ADD). |

FIG. 12 illustrates a function of right bit of the mode register set by the above-explained mode register setting instruction WTCD4. The substantially same function of the mode register of the PA controller is assigned to this function of the CA controller. The data set to the mode register is designated by the address bits A2 to A7 (5 bits in total).

Different from the accessing instruction of the PA controller, the accessing instruction of the CA controller can simultaneously execute both of the addressing process and the input/output process of the target data in a real time when the memory array is accessed. Also, a designation can be done at the same time whether or not the PGCAS signal corresponding to the initiation trigger signal of the PA controller becomes active. That is to say, in response to the accessing instruction issued from the CA controller, the pointers "m" and "n" (namely, page pointer and column pointer) in the two-dimensionally arrangement "A" (m, n) on the memory array can be simultaneously controlled, and the input/output operations of the data can be executed in a parallel mode in conjunction with the PA controller.

FIG. 13 indicates an access instruction set supported by the CA controller. There are a double word (32 bits) access and a word (16 bit) access (upper word, lower word) as the accessing mode, whereas there are an addition (CAREG ADDition), an increment (CAREG INCrement), a decrement (CAREG DECrement), and a zero addition (No Change) as the addressing mode. The address bit A4 is used to designate whether or not the PA controller is operated in the conjunction mode (in case of A4=0, PGCAS signal becomes active, whereas in case of A4=1, PGCAS signal becomes nonactive). The W/R signal is used to designate whether the data is read or written (in case of W/R=0, data is read, whereas in case of W/R=1, data is written).

The implementation of the instruction set for CA controller into the assembler language is very easy similar to that of the PA controller. In case of the PA controller, "PGCTL" is employed as the typical mnemonic, and a mnemonic "Inst." indicative of the instruction function may be expressed by employing the operand address designation value (address label) itself. However, in the CA controller, since the operand address designation value contains the data field, it is o implemented that the mnemonic for expressing the function is coincidence with the typical mnemonic. As a result, a generic operand address designation value may be expressed by summing a specific address value for expressing this instruction with a data value to be instructed to the CA controller.

FIG. 14 represents a basic instruction set model in the CA controller expressed by the assembler language. Similar to the example of the PA controller, this basic instruction set model represents one example of CPUs belonging to i8086 and i80X86 series manufactured by Intel Corp. U.S.A. To discriminate a plurality of CA controllers from each other, a head address value of the memory array is defined as a reference address value (CACTLADDRx), and both of the offset address values for expressing the respective instructions and the designation data value n*4 or n*16, if necessary, are added to this reference address value, so that an overall operand address value is determined. In this case, the value of "n" corresponds to data to be originally designated (DT), and a value obtained by multiplying (or shifting) this value "n" by 4 or 16 corresponds to an actually designated value (n*4, n*16). Since there are two memory arrays in this memory system, the reference address value CACTLADDRx is CACTLADDR0 corresponding to the access control unit 1003, and is CACTLADDR1 corresponding to the access control unit 1004. In accordance with the present operation, when no designation data (DT) is present, the operand portion need not be designated. Even if such a designation data is present, it is not necessary to designate the operand addresses other than the designation data. An actual statement example expressed in the assembler language will now be explained.

(ex 1)
When operand data is present,

INST. <ES:CACTLx> [n*4]

INST. <ES:CACTLx> [n*16]

The above described two cases correspond to cases of designating constant data.

INST. <ES:CACTLx> [BX (or SI or DI)]

This is such a case that variable data is designated.
(ex 2)
When no operand data is present, INST. <ES:CACTLx>

In FIG. 15, there is shown a parameter model in setting data (DT) into the mode register of the CA controller.

Expressions of the data setting instructions to the mode register in the assembler language are given as follows:

SETMD <ES:CACTLx,> AX register data

SETMD <ES:CACTLx,> Imm. immediate data

FIG. 16 shows an access instruction set model in the CA controller expressed in the assembler language. The actual statement example in the assembler language is given as follows:

(ex 3)
In case of write accessing,

INST. <ES:CACTLx,> ERX (or RX or Imm.)

(ex 2)
In case of read accessing

INST. ERX (or RX or Imm.) <,ES:CACTLx>

*ERX double word register
RX word register

What is claimed is:

1. A memory control system for accessing a memory array for data processing, comprising:
   a memory array having a column address input for receiving a column address and a page address input for receiving a page address,
   wherein memory cells included in said memory array are designated by a combination of said column address provided as a column pointer and said page address provided as a page pointer;
   a processor for accessing said memory array through a bus system including a data bus, an address bus and a control bus, and generating an access instruction; and
   an access control unit for receiving access information via said access instruction and generating an access address to said memory array inclusive of both said column pointer and said page pointer, said access control unit being coupled to said processor and including a page address controller and a column address controller,
   wherein said page address controller includes (i) page register means for storing therein a page address, a first offset address and a mode of a predetermined calculation, which are received from said processor via said bus system, and (ii) page address counter means for performing said predetermined calculation on said page address and said first offset address for generating a page portion of said access address,
   wherein said column address controller includes (i) column register means for storing therein a column address, a second offset address and a mode of a preselected calculation, which are received via said bus system from said processor, and (ii) column address counter means for performing said preselected calculation on said column address and said second offset address for generating a column portion of said access address,
   wherein succeeding access addresses are generated on a basis of said page address counter means performing said predetermined calculation on said page address and said first offset address and said column address counter means performing said preselected calculation on said column address and said second offset address, said column address controller generating a trigger signal for starting said page address controller during a time when said processor is accessing said memory array, and
   wherein said access control unit further includes address output means, coupled to said page address controller and said column address controller, for outputting said access address and said succeeding access addresses on a basis of said page address and said column address, in response to said access instruction, in order to access said memory array by said processor, the data bus of said bus system coupling said processor to a data terminal of said memory array.

2. A memory control system according to claim 1, wherein said column register means comprises:
   a plurality of first register banks each having a set of a column address and an offset; and
   first bank selecting means for selecting one of said plurality of first register banks in response to said access instruction.

3. A memory control system according to in claim 2, wherein said page register means comprises:
   a plurality of second register banks each having a set of a page address and an offset; and second bank selecting means for selecting one of said plurality of second register banks in response to said access instruction.

4. A memory control system according to claim 3, wherein said processor comprises:

access instruction means for providing said access instruction through said address bus to said access control unit when data in said memory array is accessed by said processor via said data bus.

5. A memory control system according to claim 3, wherein said page register means further comprises:

a mode register coupled to said plurality of second register banks, respectively, for storing therein increment mode information, decrement mode information, or offset addition mode information, which are inputted from said processor, wherein each said page address within said plurality of second register banks is calculated in response to a holding mode in connection with a processing operation for an instruction issued from said processor.

6. A memory control system according to claim 5, further comprising:

a selector for selecting an output from an offset register bank and immediate address data derived from said processor, wherein said selector performs the selection between said output and said immediate address data in response to an output from said mode register.

7. A memory control system according to claim 6, wherein said processor is provided with another bus system used to access another subsystem and a resource which requires the normal linear accessing operation.

8. A memory control system according to claim 3, wherein a multiplexer and a temporary register directly accessible from said processor are included in said page address controller, and an address read by said multiplexer from said second register banks and an address set to said temporary register are selected to be outputted.

9. A memory control system according to claim 2, wherein said column register means further comprises:

a mode register coupled to said plurality of first register banks, respectively, for storing therein increment mode information, decrement mode information, or offset addition mode information, which are inputted from said processor, wherein each said column address within said plurality of first register banks is calculated in response to a holding mode in connection with a processing operation for an instruction issued from said processor.

10. A memory control system according to claim 2, wherein said column address controller further comprises:

a latch for temporarily storing a column pointer produced by said column address counter means and a page pointer produced by said page address counter means; and control means for outputting the two pointers from said latch to said memory array by coinciding timings with each other.

11. A memory control system according to claim 2, wherein a temporary register for a first column address capable of transferring data along with said column address data from a column register is included in said column address controller.

12. A memory control system according to claim 11, wherein said processor executes an accessing operation to said memory system and an accessing operation to either another subsystem or a resource in parallel.

13. A memory control system according to claim 2, wherein a temporary register for a first page address capable of transferring data along with a page address register is included in said page address controller.

14. A memory control system according to claim 2, wherein a multiplexer and a temporary register directly accessible from said processor are included in said column address controller, and an address read by said multiplexer from said first register banks and an address set to said temporary register are selected to be outputted.

15. A memory control system according to in claim 1, wherein said page register means comprises:

a plurality of register banks each having a set of a page address and an offset; and bank selecting means for selecting one of said plurality of register banks in response to said access instruction.

16. A memory control system according to claim 1, wherein said column register means is comprised of a column address register file including a plurality of column address register sets each including a plurality of column address registers, and said column address counter means includes a column address counter for producing said column pointer based upon an offset address separately provided for the column and an address set from said processor into said column address register file; and wherein said page register means is comprised of a page address register file including a plurality of page address register sets each including a plurality of page address registers, and said page address counter means includes a page address counter for producing said page pointer based upon an offset address separately provided for the page and an address set from said processor into said page address register file.

17. A memory control system according to claim 16, wherein both of said plurality of column address registers and said plurality of page address registers are capable of setting an arbitrary value thereto, respectively.

18. A memory control system according to claim 16, wherein said column address register file further includes a column offset register comprised of a plurality of offset column address register sets each set including a plurality of offset column address registers, and a first selecting circuit for performing both a selection between said column address register sets and said column offset register and a selection of the column address registers within said selected column address register set, and based on contents of the column address registers from a respective column address register set and an offset register of a corresponding offset column address register set selected by said first selecting circuit, said column address counter produces the column pointer.

19. A memory control system according to claim 18, wherein each of the register sets of said column offset register employs a mode register, and the content of said column offset register is updated by the accessing operation by said processor in response to a mode set into said mode register.

20. A memory control system according to claim 16, wherein said page address register file further includes a page offset register comprised of a plurality of offset page address register sets each set including a plurality of offset page address registers, and a selecting circuit for performing both a selection between said page address register sets and said page offset register and a selection of the page address registers within said selected page address register set, and based on contents of the page address registers from a respective page address register set and an offset register of a corresponding offset page address register set selected by said selecting circuit, said page address counter produces the page pointer.

21. A memory control system according to claim 20, wherein each of the register sets of said page offset register employs a mode register, and the content of said page offset register is updated by the accessing operation by said processor in response to a mode set into said mode register.

22. A memory control system according to claim 1, wherein two-dimensionally arranged data in which an element is determined to a set of a column number and a row number, is stored into said memory array in such a manner that said column number can be designated by said column pointer and said row number can be designated by said page pointer, and an access to said two-dimensionally arranged data is performed by performing said page pointer and said column pointer from said processor.

23. A memory control system according to claim 1, wherein a portion of said memory control system corresponding to said access control unit, which is inclusive of said page address controller and said column address controller, is fabricated within a central processing unit in an integrated circuit form.

24. A memory control system according to claim 1, wherein said processor comprises:
access instruction means for providing said access instruction through said address bus to said access control unit when data in said memory array is accessed by said processor via said data bus.

25. A memory control system according to claim 1, wherein said page address controller initiates an updating of contents of said page address counter in response to receiving said trigger signal from said column address controller.

26. A memory control system for accessing a memory array for data processing, comprising:
a memory array having a column address input for receiving a column address and page address input for receiving a page address,
wherein memory cells included in said memory array are designated by a combination of said column address provided as a column pointer and said page address provided as a page pointer;
a processor for accessing said memory array through a bus system including a data bus, an address bus and a control bus, and generating an access instruction; and
an access control unit coupled to receive from said processor, via said bus system, an access information on a basis of said access instruction and generating an access address to said memory array inclusive of both said column pointer and said page pointer, said access control unit being constituted by a page address controller and a column address controller,
wherein said page address controller includes (i) a page register file for storing therein a page address, a first offset address and a mode of a predetermined calculation, which are received from said processor via said bus system, and (ii) a page address counter for performing said predetermined calculation to said page address with said first offset address for generating a page address portion of said access address and of succeeding access addresses,
wherein said column address controller includes (i) a column register file for storing therein a column address, a second offset address and a mode of a preselected calculation, which are received from said processor via said bus system, and (ii) a column address counter for performing said preselected calculation to said column address with said second offset address for generating a column address portion of said access address and of said succeeding access addresses,
wherein said succeeding access addresses are generated on a basis of said page address counter performing said predetermined calculation on said page address and said first offset address and said column address counter performing said predetermined calculation on said column address and said second offset address, said column address controller generating a trigger signal for starting said page address controller during a time when said processor is accessing said memory array, and
wherein contents of a page address register, included in said page register file, are updated when said processor is accessing said memory array in response to said trigger signal from said column address controller, said processor inputting/outputting data to a memory location of said memory array determined by said access address.

27. A memory system for accessing a memory control array according to claim 26, wherein said page address counter includes means for incrementing/decrementing contents of said page address register.

28. A memory control system for accessing a memory array according to claim 26, wherein said page address counter updates contents thereof using a previously stored offset address.

29. A memory control system for accessing a memory array for data processing on a basis of an instruction from a processor, said memory array having memory cells accessed with a combination of a two-dimensional address, comprising:
register means, coupled to said processor, for storing therein a first address, a second address, a first offset address, a second offset address, and a mode of calculation indicating how to perform a calculation on said first address and said first offset address and on said second address and said second offset address, which are received from said processor;
address counter means, connected with said register means, for performing said calculation on said first address and said first offset address to provide a page address, and on said second address and said second offset address to provide a column address to access said memory array,
wherein said address counter means performs additional calculations on said page address and said first offset address to provide succeeding page addresses and on said column address and said second offset address to provide succeeding column addresses during a memory access operation to said memory array with said page and column addresses; and
address output means for outputting said page address, said column address, said succeeding page addresses, and said succeeding column addresses to said memory array.

30. A memory control system for accessing a memory array for data processing, comprising:
a memory array having a column address input and a page address input;
a processor for accessing said memory array by generating an access instruction;
an address controller coupled to receive from said processor via an access-instruction bus an access information on a basis of said access instruction and generating an access address to said memory including a column address and a page address;

a data bus connected between said memory array and said processor, an address bus connected between said memory array and said address controller, wherein said address controller includes page and column address counters, and page and column address latches respectively latching outputs of said page and column address counters, and wherein page and column addresses are provided from said page and column address latches, respectively, to said memory array for accessing data when said processor provides to said address controller, via said access-instruction bus, address information for generating succeeding addresses.

* * * * *